US010763189B2

(12) United States Patent
Meijer et al.

(10) Patent No.: US 10,763,189 B2
(45) Date of Patent: Sep. 1, 2020

(54) SEALING ARRANGEMENT

(71) Applicant: International Business Machines Corporation, Armonk, NY (US)

(72) Inventors: Ingmar G. Meijer, Zurich (CH); Stefano S. Oggioni, Besana in Brianza (IT); Stephan Paredes, Zurich (CH); Gerd Schlottig, Uitikon Waldegg (CH)

(73) Assignee: International Business Machines Corporation, Armonk, NY (US)

( * ) Notice: Subject to any disclaimer, the term of this patent is extended or adjusted under 35 U.S.C. 154(b) by 798 days.

(21) Appl. No.: 14/830,310

(22) Filed: Aug. 19, 2015

(65) Prior Publication Data

US 2016/0061365 A1 Mar. 3, 2016

(30) Foreign Application Priority Data

Aug. 29, 2014 (IT) ................ MI2014A1523

(51) Int. Cl.
*F16L 25/04* (2006.01)
*F16L 5/10* (2006.01)
*H01L 23/473* (2006.01)

(52) U.S. Cl.
CPC .............. *H01L 23/473* (2013.01); *F16L 5/10* (2013.01); *F16L 25/04* (2013.01); *H01L 2924/0002* (2013.01)

(58) Field of Classification Search
CPC ..................................... F16L 5/10; F16L 25/04
USPC ... 285/124.5, 285.1, 381.1, 286.1, 369, 413, 285/417, 425, 905
See application file for complete search history.

(56) References Cited

U.S. PATENT DOCUMENTS

| 3,640,552 | A | * | 2/1972 | Demler, Sr. | ........... | F16L 37/084 |
| | | | | | | 285/110 |
| 5,876,039 | A | * | 3/1999 | Skinner | ..................... | F16L 5/08 |
| | | | | | | 277/602 |
| 5,988,700 | A | | 11/1999 | Prichard | | |
| 6,783,160 | B2 | | 8/2004 | Rowley | | |
| 8,256,801 | B2 | * | 9/2012 | Hagen | ...................... | F16L 5/14 |
| | | | | | | 285/124.1 |

(Continued)

FOREIGN PATENT DOCUMENTS

CN 101793336 B 7/2013

OTHER PUBLICATIONS

Uhl et al., "Luer Lock Connector," ip.com, IP.com No. 000213128, Dec. 5, 2011, 13 pages.

(Continued)

*Primary Examiner* — Matthew Troutman
*Assistant Examiner* — Fannie C Kee
(74) *Attorney, Agent, or Firm* — Erik K. Johnson

(57) ABSTRACT

An embodiment of the invention may include a sealing apparatus. The sealing apparatus may include a first component having a body, where the body has an outer surface and a first arm protruding from the outer surface. The first arm includes an inner surface facing the outer surface of the body. The sealing apparatus may include a second component engaged by the first arm of the first component. The second component may have a first portion arranged inside a space between the inner surface of the first arm and the outer surface of the body and a second portion arranged outside of the space and adjacent to an outer surface of the first arm.

15 Claims, 21 Drawing Sheets

(56) References Cited

U.S. PATENT DOCUMENTS

| | | | |
|---|---|---|---|
| 8,371,622 B2 | 2/2013 | King, Jr. et al. | |
| 2003/0080554 A1* | 5/2003 | Schroeder | F16L 21/08 |
| | | | 285/125.1 |
| 2006/0022458 A1 | 2/2006 | Droste et al. | |
| 2007/0126233 A1* | 6/2007 | Gashgaee | F04B 53/16 |
| | | | 285/384 |

OTHER PUBLICATIONS

Goobich, "A Unique Metal-to-Metal Seal for Separable Joints," SAE International, Feb. 1, 1967, 1 page (abstract only).

* cited by examiner

SEALING ARRANGEMENT

BACKGROUND

The invention relates to a sealing arrangement, an apparatus, a use of a sealing arrangement and a method for manufacturing a sealing arrangement.

A sealing arrangement including a first and a second component together defining a fluid seal therebetween is generally known in the art. This kind of sealing arrangement is used in applications where a fluid, for example a liquid or gas, is transported or stored. For example, two pipes may be connected by a sealing arrangement to prevent fluid from leaking out at a connection interface between the two pipes.

It has been found that fluid seals leak for various reasons. For example, the fluid pressure of the fluid contained may become too high. Or, corresponding sealing surfaces of the first and second component change their shape due to thermal, chemical or age-related shrink. When the sealing arrangement is subjected to mechanical stresses, creep and fatigue may also play a role in the fluid seal developing a leak.

BRIEF SUMMARY

An embodiment of the invention may include a sealing apparatus. The sealing apparatus may include a first component having a body, where the body has an outer surface and a first arm protruding from the outer surface. The first arm includes an inner surface facing the outer surface of the body. The sealing apparatus may include a second component engaged by the first arm of the first component. The second component may have a first portion arranged inside a space between the inner surface of the first arm and the outer surface of the body and a second portion arranged outside of the space and adjacent to an outer surface of the first arm.

An embodiment of the invention may include a method for manufacturing the sealing apparatus. The method may include providing a first component having a body with an outer surface and an arm protruding from the outer surface. The arm contains an inner surface facing the outer surface of the body. The method may include providing a second component being engaged by the arm of the first component. The second component has a first portion arranged inside a space defined between the inner surface of the arm and the outer surface of the body and a second portion arranged outside of the space and adjacent to an outer surface of the arm. The method may include providing a fluid seal between the first and second component.

BRIEF DESCRIPTION OF THE SEVERAL DRAWINGS

Figure 1:
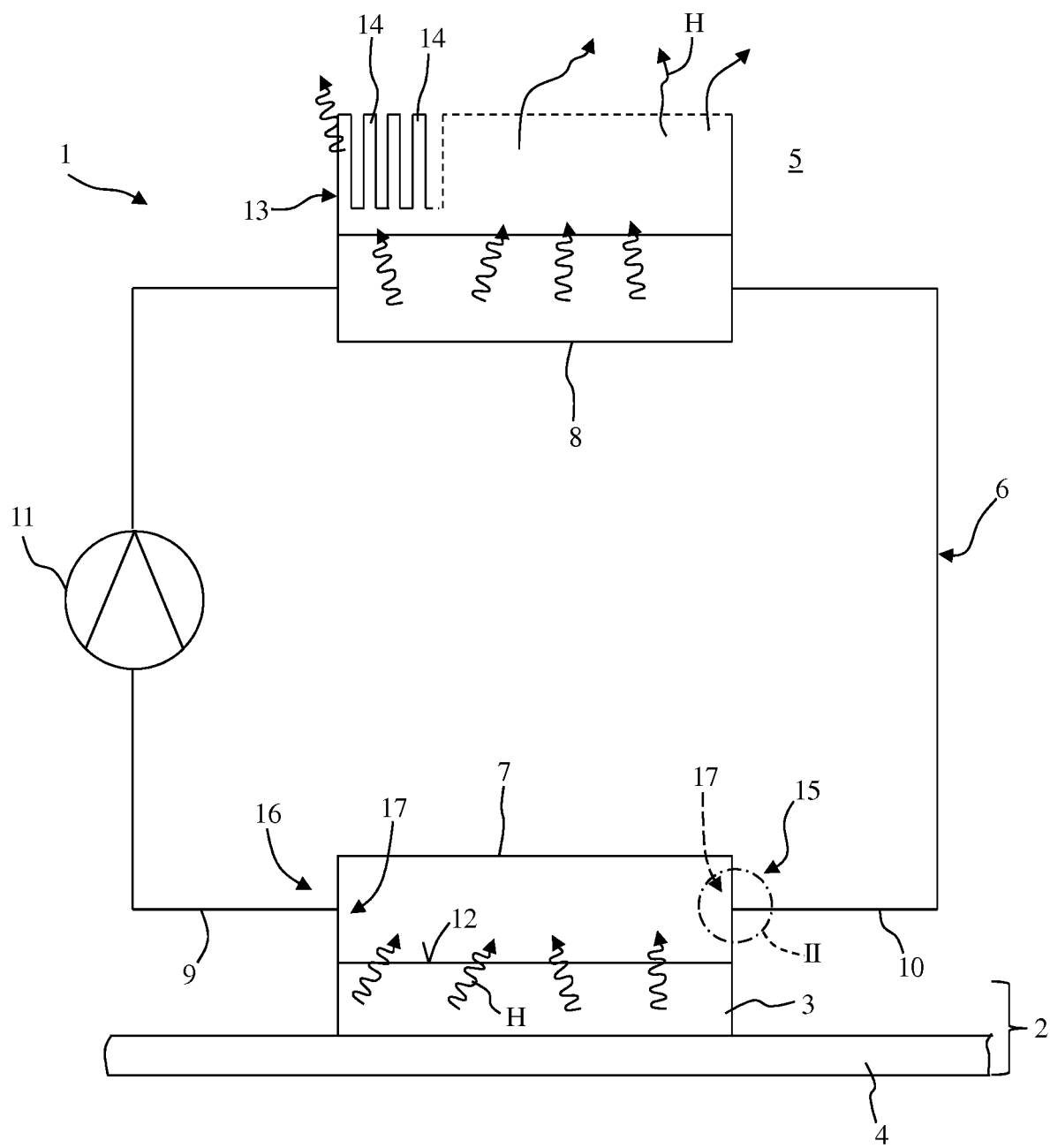
FIG. 1 shows schematically an apparatus according to an embodiment.

Similar or functionally equivalent elements in the Figures have been allocated the same reference signs, if not otherwise indicated.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the inven-

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

FIG. 1 illustrates schematically a water-cooling apparatus 1. The water-cooling apparatus 1 according to the present embodiment is a water-cooling apparatus for cooling, for example, a microelectronic device 2. The microelectronic device 2 may include an integrated circuit (IC) chip 3 mounted on a circuit board (PCB) 4. The water-cooling apparatus 1 is configured to absorb heat H from the IC chip 3 at a first location and release the heat H at a second location to the environment 5.

The water-cooling apparatus 1 includes a closed circuit 6 having, for example, IC casing 7, heat exchanger casing 8, IC outlet tube 9, IC inlet tube 10 and a pump 11.

The IC casing 7 may be attached to or integrated into the IC chip 3. The IC casing 7 may be attached to a surface 12 of the IC chip 3 facing away from the PCB 4.

The IC casing 7 is fluidly connected by the IC outlet tube 9, via the pump 11, to the heat exchanger casing 8.

The heat exchanger casing 8 may be attached to or integrated into a radiator 13 having fins 14. As air passes over the fins 14, heat H is released to the environment 5.

The IC inlet tube 10 fluidly connects the heat exchanger casing 8 to the IC casing 7. At the point of connection 15 of the IC inlet tube 10 to the IC casing 7, or at any other suitable location within the water-cooling apparatus 1, for example at the point of connection 16 of the IC outlet tube 9 to the IC casing 7, the water-cooling apparatus 1 includes a sealing arrangement 17 illustrated in FIG. 2A.

Figure 2A:
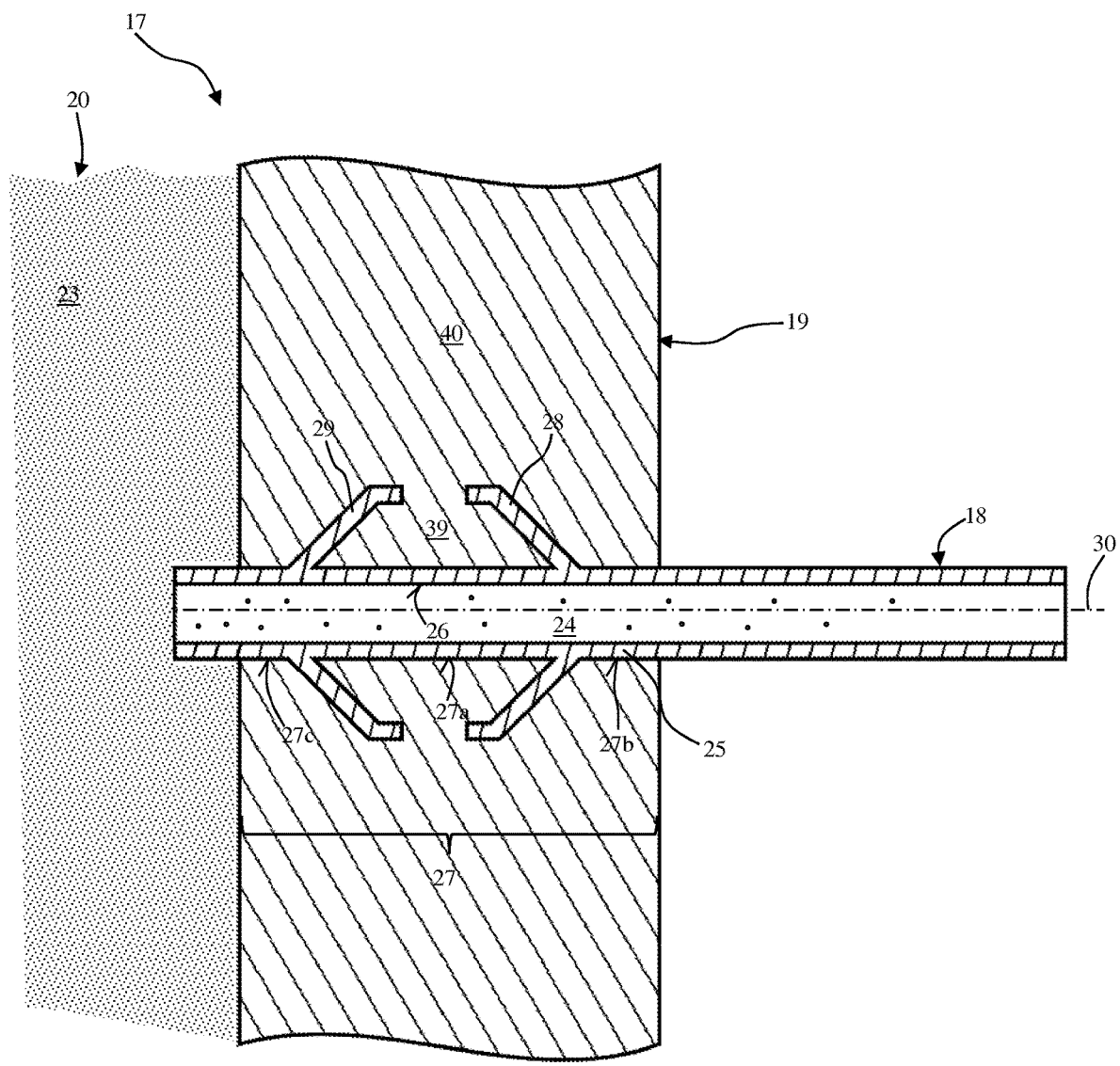
FIG. 2A shows, in an enlarged section view II from FIG. 1, a sealing arrangement according to an embodiment.

Before proceeding to FIG. 2A, it should be pointed out that the sealing arrangement 17 could be used in any other water-cooling apparatus 1, containing a first fluid reservoir 7, a second fluid reservoir 8, an IC outlet tube 9 and an IC inlet tube 10 which need to be connected to one another in a sealing manner. In particular, the water-cooling apparatus 1 may be configured for supplying an electrochemical fluid to the IC chip 3 rather than a cooling liquid 20 (see FIG. 2A), for example water. The electrochemical liquid may be configured to transfer electrical power to the IC chip 3. At the same time of course, the electrochemical fluid can also be used as a coolant.

Now having regard to FIG. 2A, it is shown that the sealing arrangement 17 includes a first component 18 and a second component 19. The first component 18 is an end portion of the IC inlet tube 10, and the second component 19 is a portion of a wall of the IC casing 7.

The first component 18 pierces through the second component 19 into a fluid chamber 23 filled with the cooling liquid 20. The first component 18 defines a channel 24 for delivering the cooling liquid 20 into the fluid chamber 23.

Figure 2B:
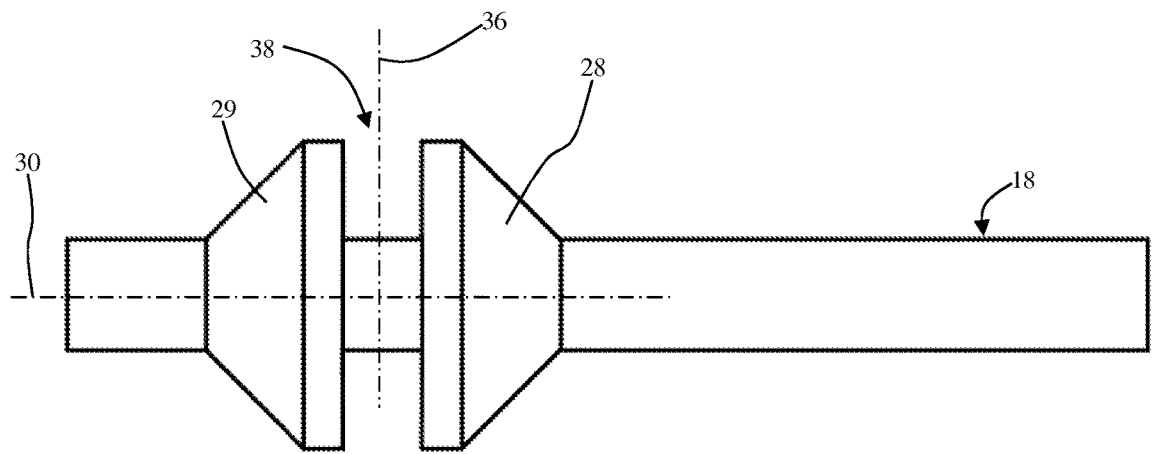
FIG. 2B shows, in a side view, a first component of the sealing arrangement of FIG. 2A.
Figure 2C:
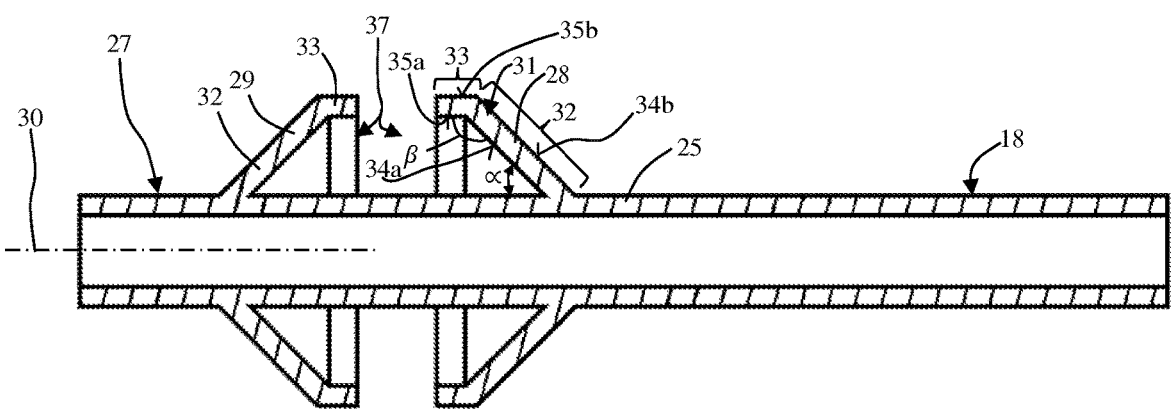
FIG. 2C shows a cross-section view along the length of the first component from FIG. 2B.

The first component 18 is illustrated in more detail in FIGS. 2B and 2C, wherein FIG. 2B shows a side view and FIG. 2C a lengthwise section view from FIG. 2B.

The first component 18 includes a tubular body 25 having an inner surface 26 defining the channel 24 and an outer surface 27. The outer surface 27 is divided into three portions: first surface 27a, second surface 27b, third surface 27c. The cross-section of the tubular body 25 may be that of a circular, oval or rectangular ring or frame, for example.

Further, the first component 18 includes two collars, a first collar 28 and a second collar 29. The first collar 28 and second collar 29 protrude from the outer surface 27 of the tubular body 25 radially outward. "Radial", "actual" and "circumferentially" herein refer to a center axis 30 of the tubular body 25. The tubular body 25 has a constant cross-section along the center axis 30, for example.

As, for example, shown in FIG. 2C, the first collar 28 and second collar 29 are formed in one piece with and of the same material as the tubular body 25. For example, the tubular body 25 and the first collar 28 and second collar 29 may be cast or molded in one piece. Preferably, the tubular body 25 and the first collar 28 and second collar 29 are made of plastics or plastic composites.

In other embodiments, the tubular body 25 and the first collar 28 and second collar 29 are made as separate components. In this case, the first collar 28 and second collar 29 may be fastened, for example glued, screwed or otherwise connected, to the tubular body 25. Especially in this case, the tubular body 25 and the first collar 28 and second collar 29 may be manufactured from different materials. For example, the tubular body 25 may be made of plastics, and the first collar 28 and second collar 29 of metal.

Now, the shape of the first collar 28 and second collar 29 will be explained in more detail. For reasons of brevity, reference will only be made to the first collar 28, while second collar 29 may share similar features.

The first collar 28 includes an elongate cross-section 31, which is why the first collar 28 and second collar 29 are also generally referred to as "arms" herein. Yet, the first collar 28 is only one example of an "arm" as used herein, and others described below may be implemented.

The first collar 28 has an first arm portion 32 and an second arm portion 33. The first arm portion 32 extends obliquely at an angle α from the outer surface 27. For example, the angle α may range between 0 and 90°, preferably between 30 and 80°. In the example, the angle α is 45°. The second arm portion 33 is connected to an outer end of the first arm portion 32. Further, the second arm portion 33 is inclined with respect to the first arm portion 32. In an example embodiment, the second arm portion 33 extends parallel, or substantially parallel, to the outer surface 27. The angle of inclination of the second arm portion 33 with respect to the first arm portion 32 is designated with the reference sign β. Of course, if the angle α and the angle β do not add up to 180°, the inner surface 35a may also extend non-parallel with respect to the outer surface 27.

The first collar 28 may have a constant wall thickness along the first arm portion 32 and the second arm portion 33 may also have the same wall thickness as the tubular body 25.

Preferably, the first collar 28 is rotationally symmetric about the center axis 30, as seen in FIG. 2B. Further the first collar 28 and second collar 29 may also be formed symmetrically to each other about an axis 36 perpendicular to the center axis 30, i.e. the second collar 29 is the minor image of the first collar 28.

According to the embodiment of FIGS. 2A to 2C, the first collar 28 and second collar 29 are arranged so that the second arm portions 33 face towards each other (and not away from each other). Thus, a space 37 is encompassed between the first collar 28 and second collar 29, which is closed except for a radial opening 38.

Now returning to FIG. 2A, it is shown that the second component 19 includes a second component first portion 39 and a second component second portion 40. The second component first portion 39 is arranged inside the space 37 enclosed by the first collar 28 and second collar 29 as explained in connection with FIG. 2C. The second component first portion 39 is thus at least partially arranged between the first portion inner surface 34a and second portion inner surface 35a of the first collar 28, on the one hand, and the first surface 27a of the outer surface 27 of the tubular body 25 on the other hand.

The first arm portion 32 has an first portion outer surface 34b, and the second arm portion 33 has an second portion outer surface 35b. In an embodiment, the first portion inner surface 34a is parallel, or substantially parallel, to the first portion outer surface 34b as well as the second portion inner surface 35a is parallel, or substantially parallel, to the second portion outer surface 35b.

The second component second portion 40 is arranged outside of the space encompassed by the inner surface of the first collar 28, the inner surface of the second collar 29 and the outer surface 27 of the tubular body 25. The second component second portion 40 is arranged adjacently to the second surface 27b and third surface 27c of the outer surface 27 as well as to the first portion outer surface 34b and second portion outer surface 35b of the first collar 28 and second collar 29, respectively. Thus, the second component second portion 40 completely encloses the portion of the tubular body 25 having the first collar 28 and second collar 29 in a circumferential and axial direction. As is also evident from FIG. 2A, the first collar 28 and second collar 29 are engaged with the second component 19 (positive fit).

Figure 2D:
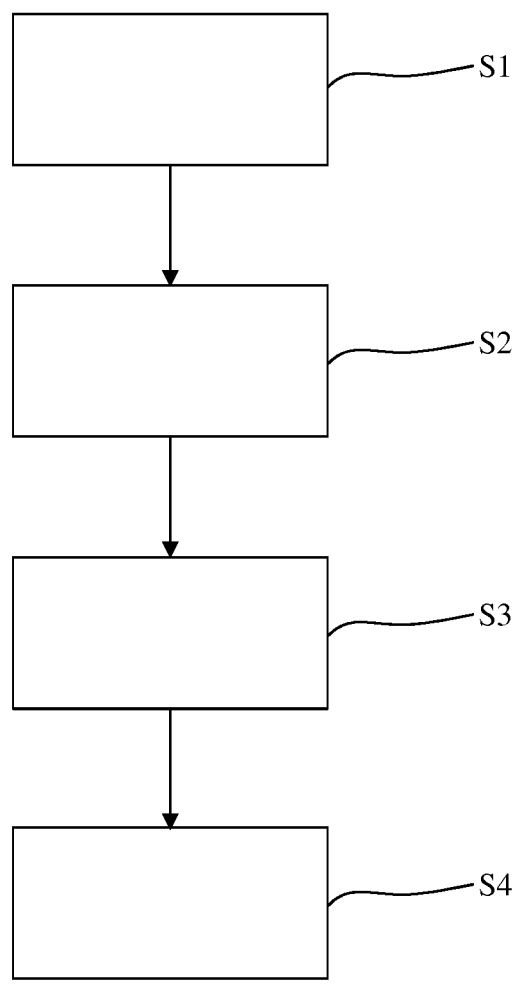
FIG. 2D shows, in a flow diagram, a method for manufacturing the sealing arrangement of FIG. 2A.

With reference to FIG. 2D, a method for manufacturing the sealing arrangement 17 of FIG. 2A will be explained.

In a first step S1, the first component 18 is provided. This may encompass, for example, casting the first component 18 including the tubular body 25 and the first collar 28 and second collar 29. To this end, various casting methods may be used, for example, die casting, lost core casting, etc. Alternatively, the tubular body 25 and the first collar 28 and second collar 29 are manufactured separately and assembled to form the first component 18.

Then, in step S2, the first component 18 is at least partially arranged inside an injection mold. In step S3, the second component 19 is molded over the first component 18 by injecting material, for example, plastic, into the mold. Other parts or the IC casing 7 may be produced in the same step.

In a step S4, the second component second portion 40 cools down, and a prestressing of the first component 18 and second component 19 with respect to each other may be obtained at the first surface 27a, second surface 27b, third surface 27c, first portion inner surface 34a, first portion outer surface 34b, second portion inner surface 35a and second portion outer surface 35b to provide the fluid tight seal. This prestressing may be a result of different types of shrink, in particular thermal shrink, chemical shrink or age-related shrink, also in combination. The type of shrink to be used may depend on various factors, for example fluid pressure and operating temperature.

As defined herein, thermal shrink is the result of the second component 19 contracting more than the first component 18 during cool-down from a corresponding molding process.

Chemical shrink occurs when the second component 19 contracts in the manufacturing process, in particular after molding, due to curing (formation of chemical links in the plastic).

An age-related shrink is the result of the chemical structure of the second component changing due to age. Again, this age-related shrink can be designed to result in a contraction of the second component 19 more than the first component 18.

Thus, the second component 19 is prestressed against the first component 18, thereby providing a fluid seal at at least one, some or all of the first surface 27a, second surface 27b, third surface 27c, first portion inner surface 34a, first portion outer surface 34b, second portion inner surface 35a and second portion outer surface 35b as illustrated in step S3 of FIG. 2D. Prestressing is designed to be obtained at least at the envisaged operating temperature of the sealing arrangement 17. According to the present example, the operating temperature would be approximately the temperature of the cooling liquid supplied to cool the IC chip 3 in FIG. 1.

Figure 2E:
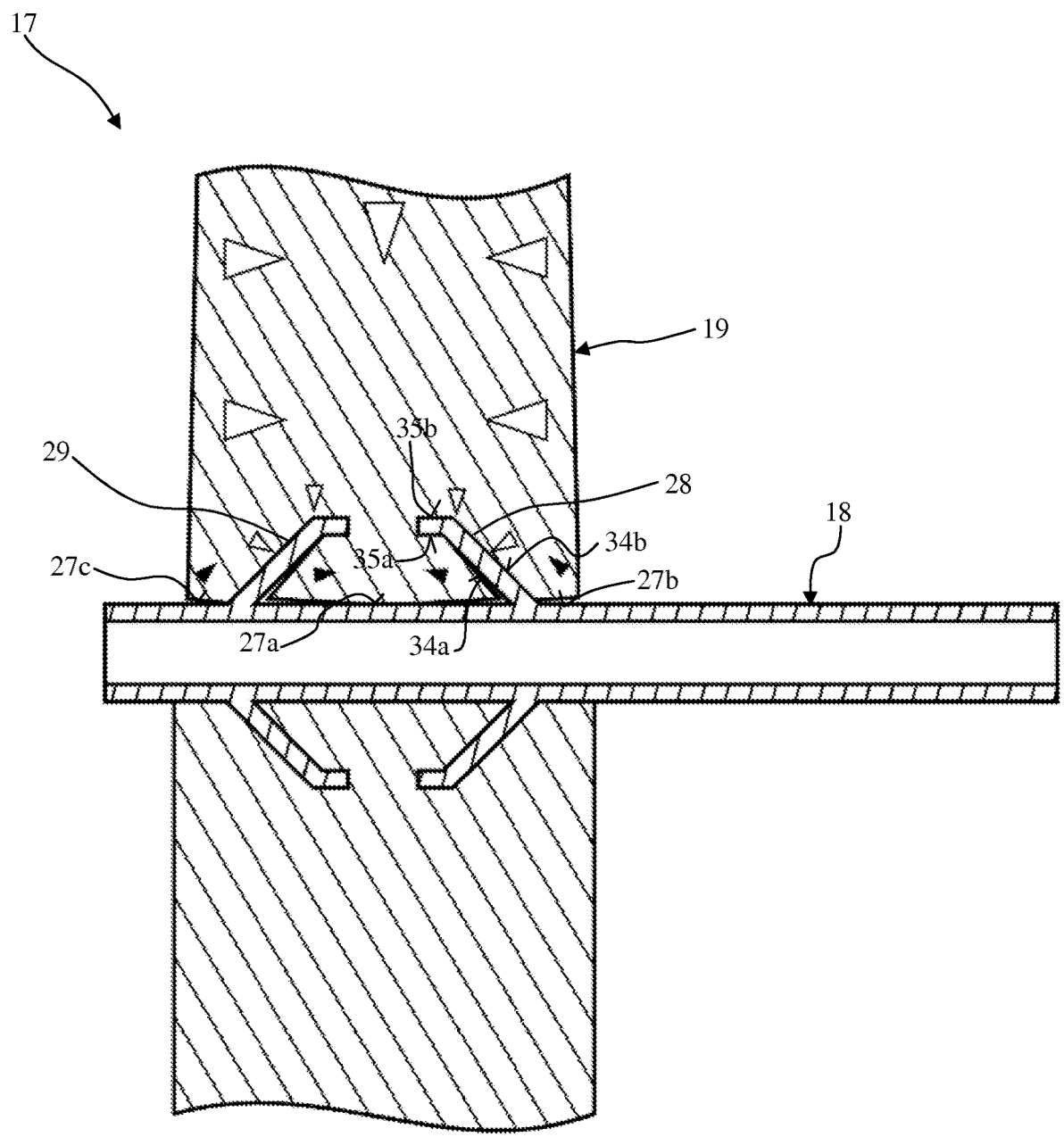
FIG. 2E shows the sealing arrangement of FIG. 2A in a compressed state.
Figure 2F:
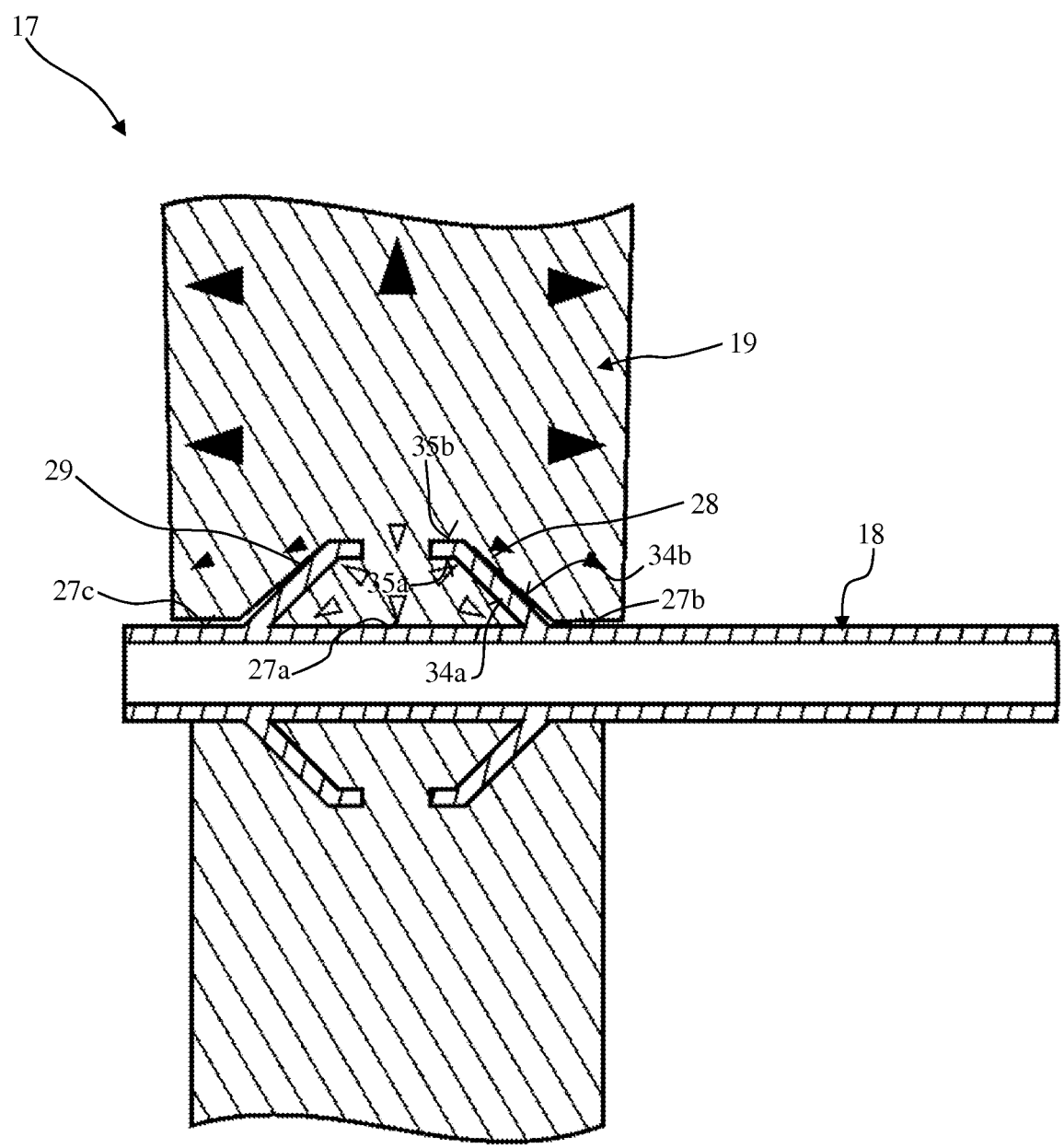
FIG. 2F shows the sealing arrangement of FIG. 2A in an expanded state.

FIGS. 2E and 2F now illustrate an example of the sealing arrangement 17 of FIG. 2A undergoing thermal cycling. Specifically, the materials of the first component 18 and second component 19 have been chosen with a different coefficient of thermal expansion (CTE). Different CTEs may be obtained, for example, by making the first component 18 of a plastic composite material and the second component 19 of a plastic. In particular, the first component 18 may include fibers changing its CTE.

Under cool conditions (cool and hot are to be understood herein merely in relative terms), the second component 19 is in a contracted state (only shown for the upper half of FIG. 2E). As can be seen in FIG. 2E, the result of this contraction is that the sealing arrangement 17 is sealed at least at first portion outer surface 34b, second portion outer surface 35b and the second portion inner surface 35a of the first collar 28 and second collar 29. On the other hand, due to the contraction, a local leak may occur at the second surface 27b, third surface 27c and first portion inner surface 34a. Yet, this cannot result in an overall leakage of the sealing arrangement 17 since the fluid seal at the first portion outer surface 34b, second portion outer surface 35b, and second portion inner surface 35a is closed in the circumferential direction.

FIG. 2F now illustrates the case of the sealing arrangement 17 undergoing a hot condition. Under hot conditions, the second component 19 expands, thus providing a fluid seal at least at the first portion inner surface 34a, second portion inner surface 35a on the first collar 28 and second collar 29 and at the first surface 27a of the tubular body 25. On the other hand, due to the expansion, a local leak may occur at the second surface 27b and third surface 27c of the tubular body 25 and at the first portion outer surface 34b of the first collar 28 and second collar 29.

It should be noted that a fluid seal is always provided at the first portion outer surface 34b of the first collar 28 and second collar 29 independent of the cool or hot state. In other words, prestressing is always present at the second portion inner surface 35a.

FIGS. 3-23 illustrate the many embodiments and orientations of first component 18, second component 19, the first collar and second collar 29. Each embodiment is only to illustrate a particular function or feature, and thus functions or features of the embodiments may be used alone, or in combination with, functions or features from the other embodiments.

Figure 3:
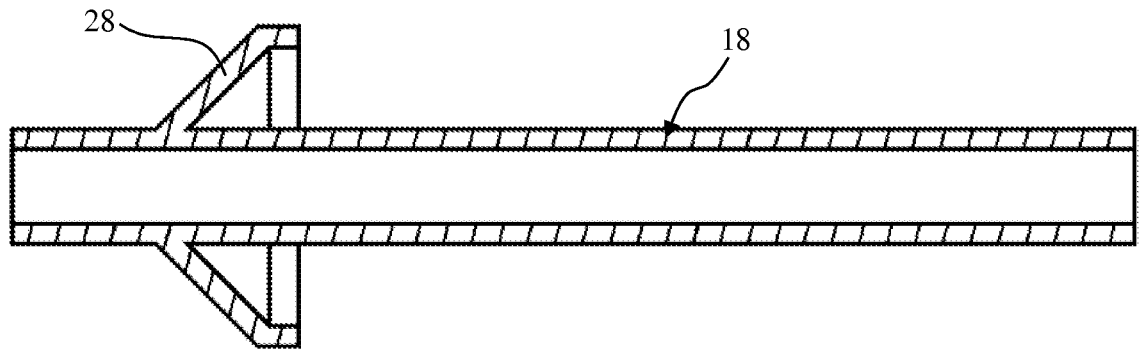
FIG. 3 illustrates a first embodiment of a collar of the first component.

FIG. 3 illustrates an embodiment of a first component 18 comprising only a single first collar 28 (hence no second collar 29).

Figure 4:
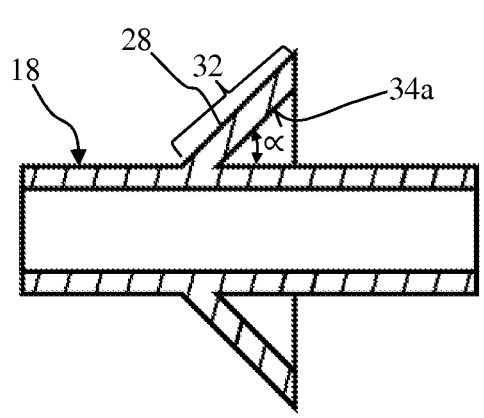
FIG. 4 illustrates a second embodiment of a collar of the first component.

FIG. 4 shows an embodiment of a first component 18 having a first collar 28, wherein the first collar 28 only has an first arm portion 32 extending at an angle α (no second arm portion 33 such as provided in the embodiment of FIG. 2C).

Figure 5:
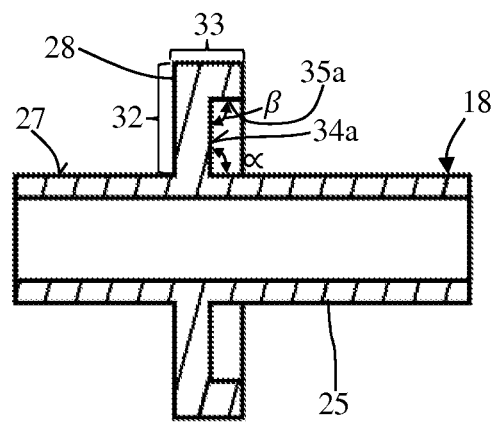
FIG. 5 illustrates a third embodiment of a collar of the first component.

FIG. 5 illustrates an embodiment of a first component 18 with a first collar 28. The first collar 28 has a first arm portion 32 extending at an angle α of 90° with respect to the outer surface 27. An second arm portion 33 of the first collar 28 extends at an angle β of 90° with respect to the first arm portion 32. Thus, the first portion inner surface 34a extends at an angle 90°, and the second portion inner surface 35a extends parallel to the outer surface 27 of the tubular body 25.

Figure 6:
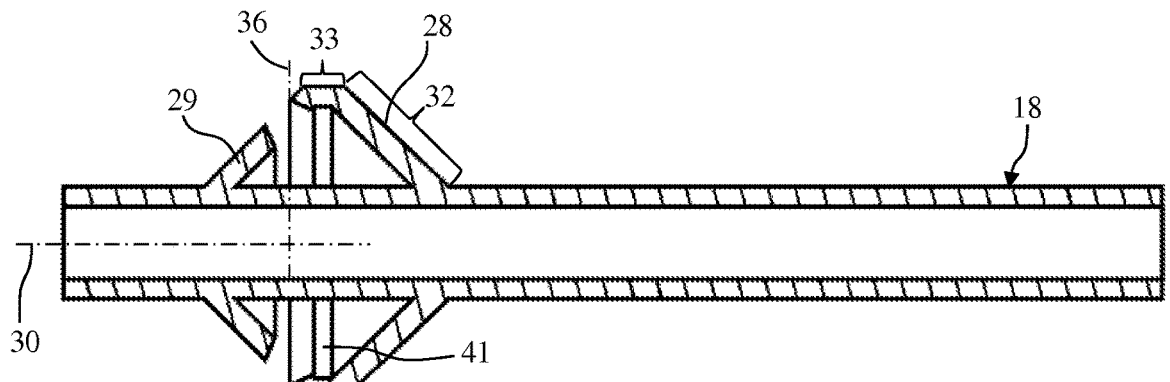
FIG. 6 illustrates a first embodiment of the orientation of the collars of the first component.

FIG. 6 illustrates an embodiment of a first component 18, wherein the first collar 28 and second collar 29 are non-symmetrical with respect to an axis 36 perpendicular to the center axis 30. Further, the embodiment of FIG. 6 combines a first collar 28 having a hook-shaped cross-section (as seen in FIG. 2C) with a second collar 29 having a straight cross-section (as seen in FIG. 4). Also, the second arm portion 33 of the first collar 28 may have an inner groove 41. The second component first portion 39 of the second component 19 (not shown) engages the inner groove 41 once molded over the first component 18, which improves sealing even further.

Figure 7:
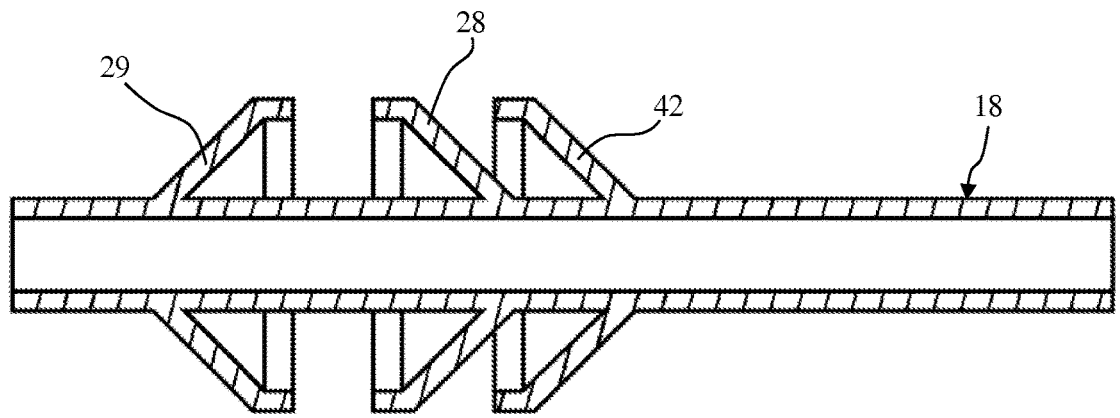
FIG. 7 illustrates a second embodiment of the orientation of the collars of the first component.

FIG. 7 shows an embodiment of a first component 18 comprising first collar 28 and second collar 29 and third collar 42. The third collar 42 is, for example, of the same shape and orientation as first collar 28. The third collar 42 is spaced apart from the first collar 28 in a direction away from the second collar 29.

Figure 8:
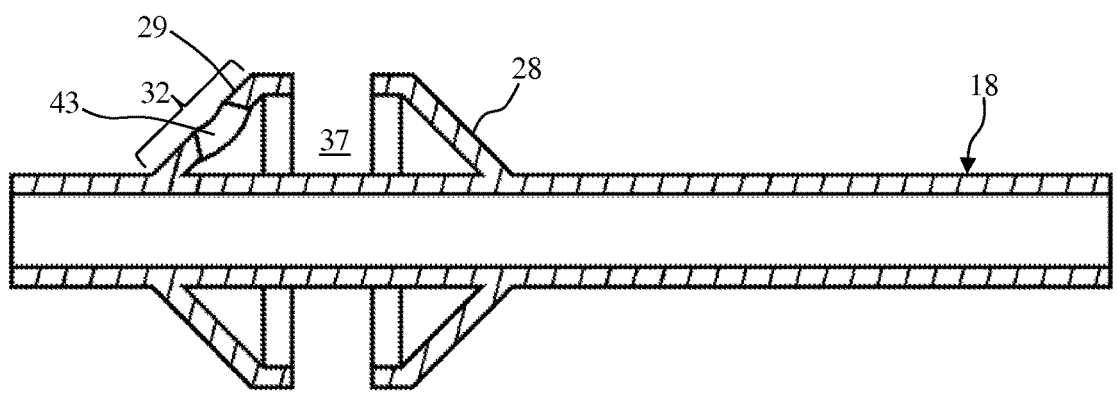
FIG. 8 illustrates a third embodiment of the orientation of the collars of the first component.

The first component 18 of FIG. 8 differs from the embodiment of FIG. 2C in that the second collar 29 has an opening or hole 43. For example, the hole 43 is formed in a first arm portion 32 of the second collar 29. For example, when molding the second component 19 over the first component 18, the hole 43 will allow material and gases to flow therethrough in order to improve the filling of the space 37 between the first collar 28 and second collar 29 during the molding process.

Figure 9:
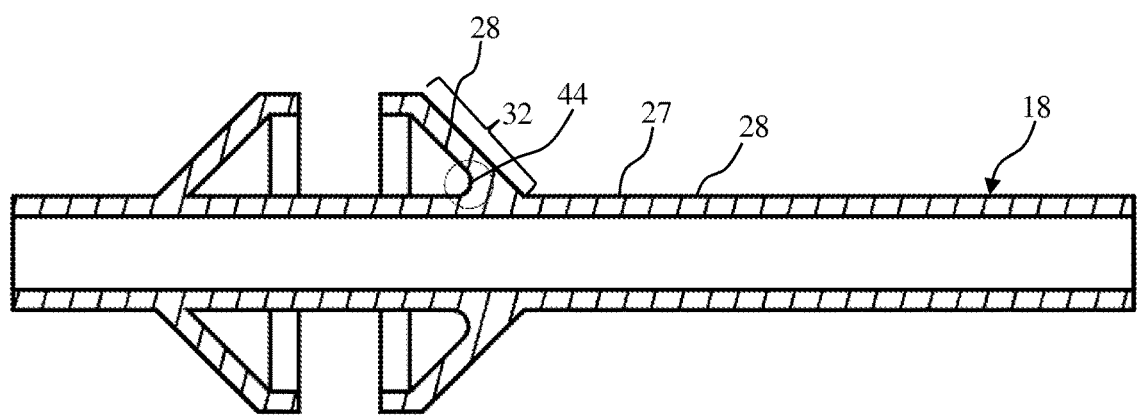
FIG. 9 illustrates a fourth embodiment of the orientation of the collars of the first component.

The first component 18 of FIG. 9 differs from the embodiment of FIG. 2C in that the first collar 28 connects to the tubular body 25 via a rounded corner 44. Specifically, the rounded corner 44 may be provided at the point where the first arm portion 32 of the first collar 28 connects to the outer surface 27 of the tubular body 25. The rounded corner reduces stresses at the point of connection.

Figure 10:
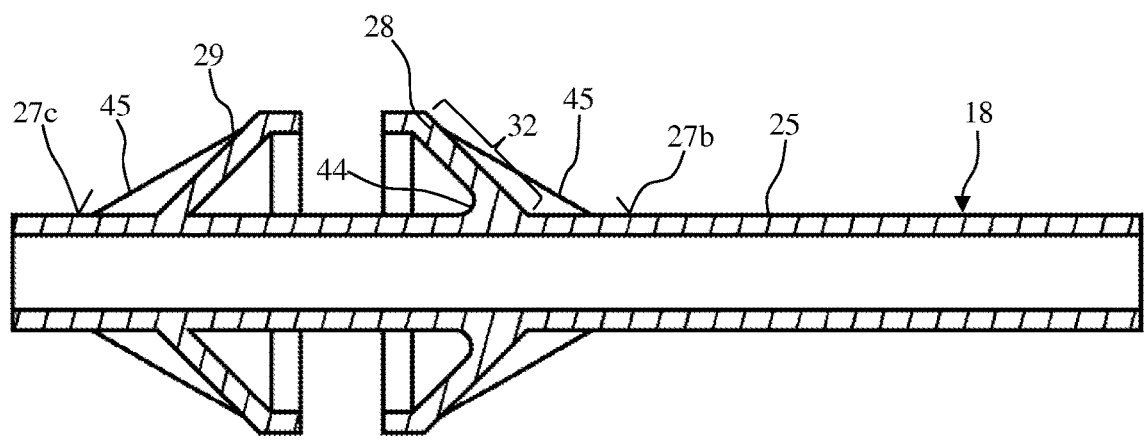
FIG. 10 illustrates a fifth embodiment of the orientation of the collars of the first component.

FIG. 10 illustrates a first component 18 which differs from the embodiment of FIG. 9 in that ribs 45 reinforcing the first collar 28 and second collar 29 are provided. For example, the ribs 45 may be connected to a respective first arm portion 32 of the first collar 28 and second collar 29 and a respective second surface 27b and a third surface 27c of the tubular body 25. The ribs 45 may be formed in one piece with the tubular body 25 and the first collar 28 and second collar 29.

Figure 11A:
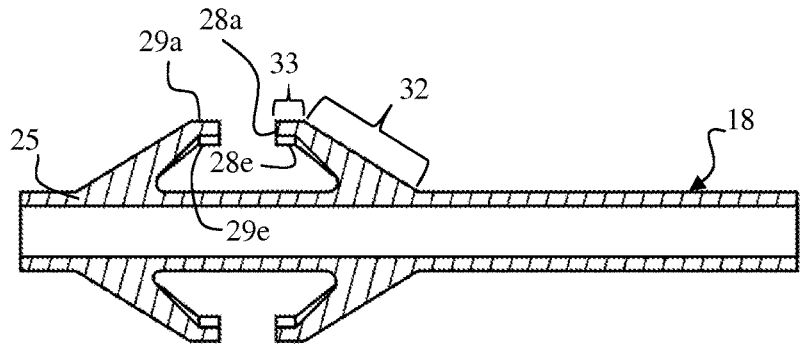
FIG. 11A illustrates, in a cross-section view along the length of the first component, an embodiment of a first component having collar sections having circumferential openings.
Figure 11B:
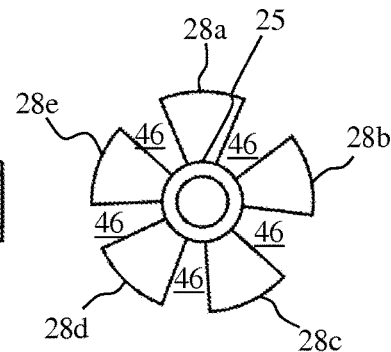
FIG. 11B illustrates an axial view of FIG. 11A.

FIGS. 11A and 11B illustrate a first component 18 having opposing groups of collar sections 28a-28e, 29a-29e defining circumferential openings 46 therebetween. Each collar section 28a-28e, 29a-29e corresponds to what is termed an "arm" herein. While five openings 46 are illustrated, more or less openings are contemplated.

Figure 11C:
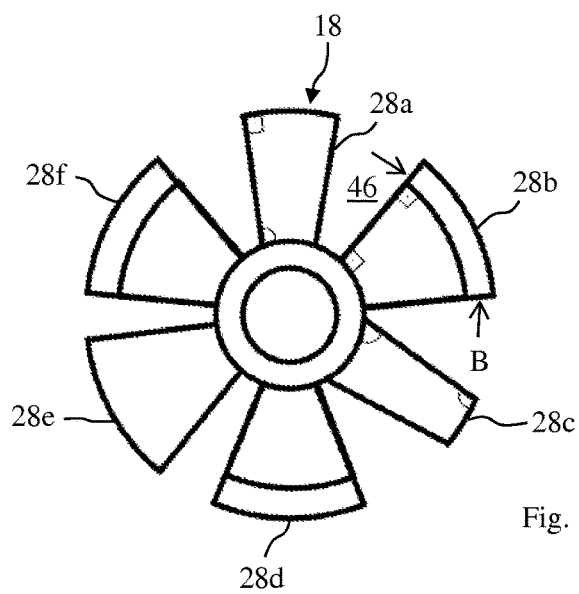
FIG. 11C illustrates an axial view of a second embodiment compared of a first component having collar sections having circumferential openings.

FIG. 11C shows the embodiment of FIG. 11B, yet the collar sections 28a-28f have a varying breadth B (e.g. radial length) in the circumferential direction.

Figure 12:
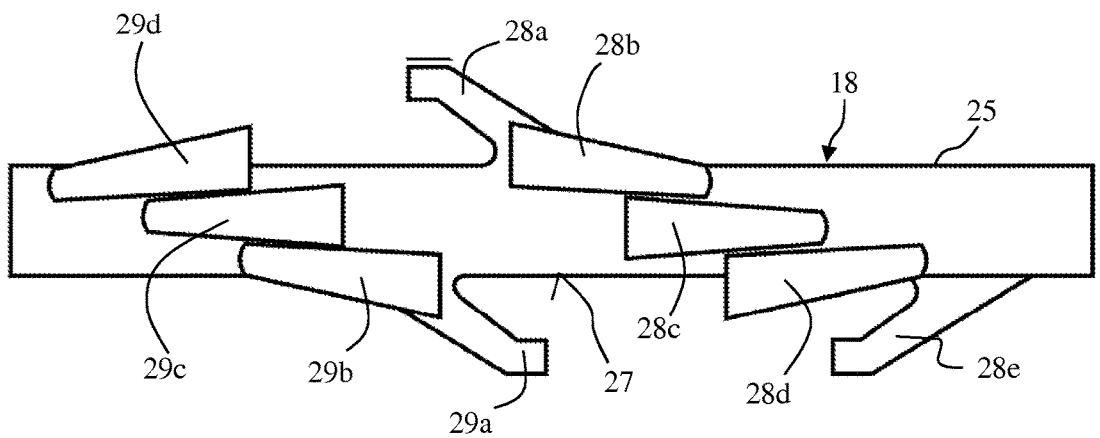
FIG. 12 shows a side view of an embodiment of a first component having collar sections arranged in a staggered manner.

FIG. 12 illustrates in an embodiment of a first component 18 having opposing groups of collar sections 28a-28e, 29a-29d, the collar sections 28a-28e, 29a-29d being staggered in the axial direction, i.e. along the center axis 30, within each group. In other words, the point at which each collar section 28a-28e, 29a-29d connects to the outer surface 27 of the tubular body 25 changes along the circumferential and axial direction.

Figure 13:
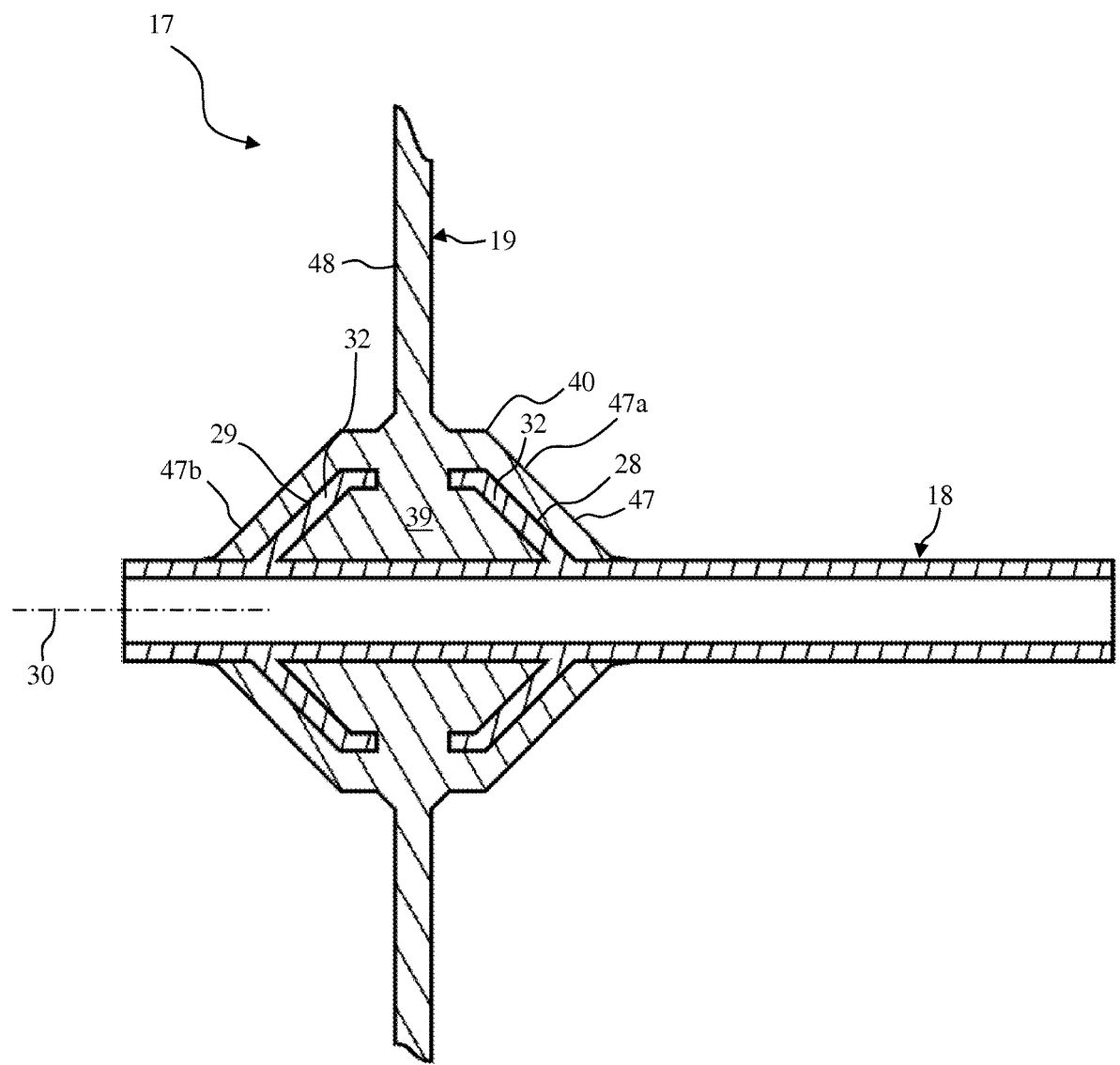
FIGS. 13 and 14 illustrate further embodiments of a sealing arrangement.

FIG. 13 illustrates a further embodiment of a sealing arrangement 17. The embodiment of FIG. 13 differs from the embodiment of FIG. 2A in that the second component second portion 40 of the second component 19 tapers down in the radial direction. For example, the second component second portion 40 has a sleeve portion 47 encapsulating the first collar 28 and second collar 29. The sleeve portion 47 has a first slanted side face 47a, and a second slanted side face 47b running parallel to the first arm portion 32 of the first collar 28 and second collar 29.

Further, the second component second portion 40 of the second component 19 has a wall portion 48 connected radially outwardly to the sleeve portion 47, preferably in one piece. The wall portion 48 has a constant wall thickness and forms the major part of an outer wall of the IC casing 7 (see FIG. 1). Thus, the wall of the IC casing 7 is only reinforced by a sleeve portion 47 in the area pierced by the first component 18, thus providing a solution that is efficient in terms of material and, at the same time, sufficiently strong.

Figure 14:
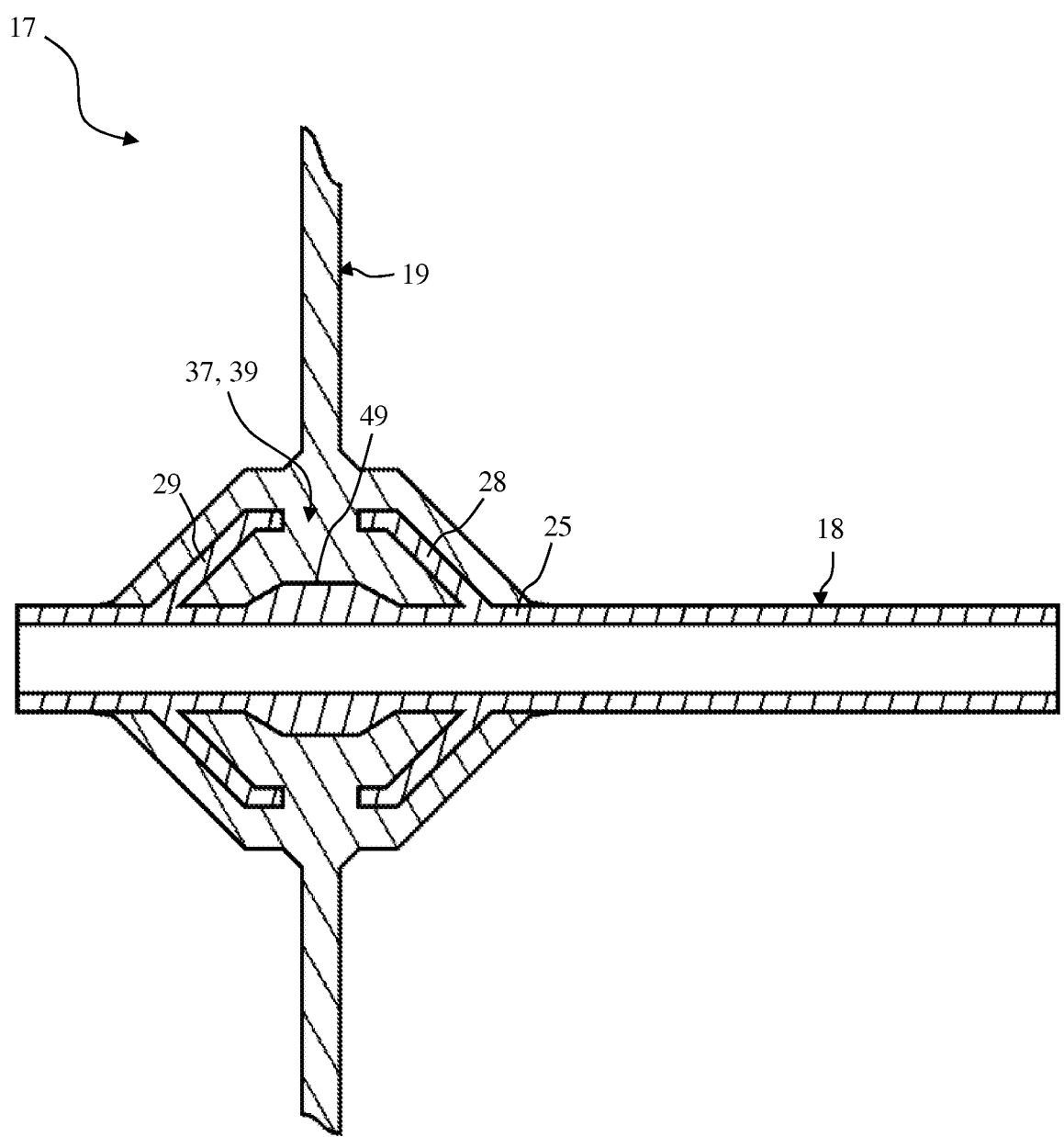

The embodiment of FIG. 14 differs from the sealing arrangement 17 of FIG. 13 in that the tubular body 25 has a thicker wall portion 49 in which the wall thickness is locally increased between the first collar 28 and second collar 29. The thicker wall portion 49 reduces the space 37 between the first collar 28 and second collar 29 and therefore reduces the space to be filled by the second component first portion 39 of the second component 19.

Figure 15A:
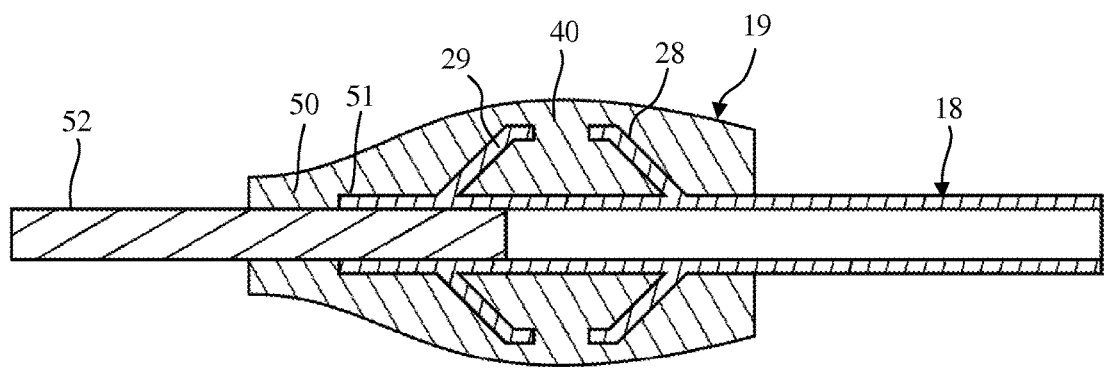
FIGS. 15A and 15B show section views from a further embodiment of a method for manufacturing a sealing arrangement.
Figure 15B:
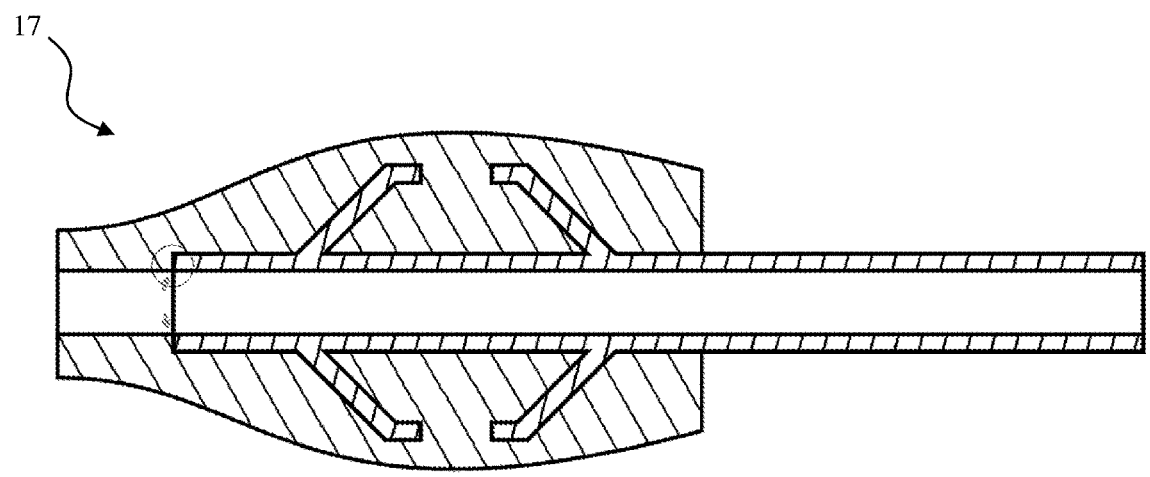

FIGS. 15A and 15B illustrate process steps in manufacturing a sealing arrangement 17 according to a further embodiment. The sealing arrangement 17 of FIGS. 15A and 15B differs from the embodiment of FIG. 2A in that the second component 19 is a sleeve and not a casing wall portion. The second component 19 may form an end portion of a tube (not shown), for example. The second component 19, for instance a second component second portion 40 thereof, may encapsulate the first collar 28 and second collar 29, and, in addition, include a portion 50 extending beyond an open end 51 of the tubular body 25 of the first component 18.

The sealing arrangement 17 may be manufactured as follows. The first component 18 is placed into a mold. Then, a mandrel 52 shown in FIG. 15A is inserted into the open end 51 of the tubular body 25 of the first component 18. In a further step, plastic is injected into the mold to form the second component 19. The mandrel 52 therein prevents the molten plastic from flowing into the tubular body 25 via the open end 51 by closing, i.e. sealing, the same.

Upon removal of the mandrel 52, the sealing arrangement 17 as shown in FIG. 15B is obtained.

Figure 16A:
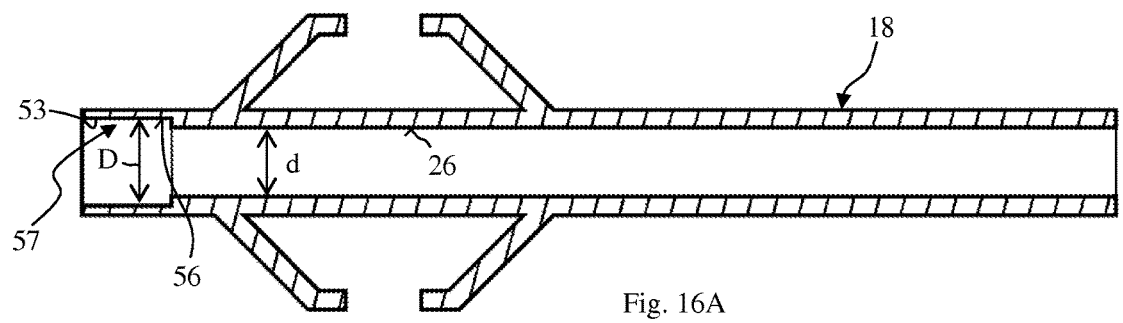
FIGS. 16A to 16C show section views from a further embodiment of a method for manufacturing a sealing arrangement.
Figure 16B:
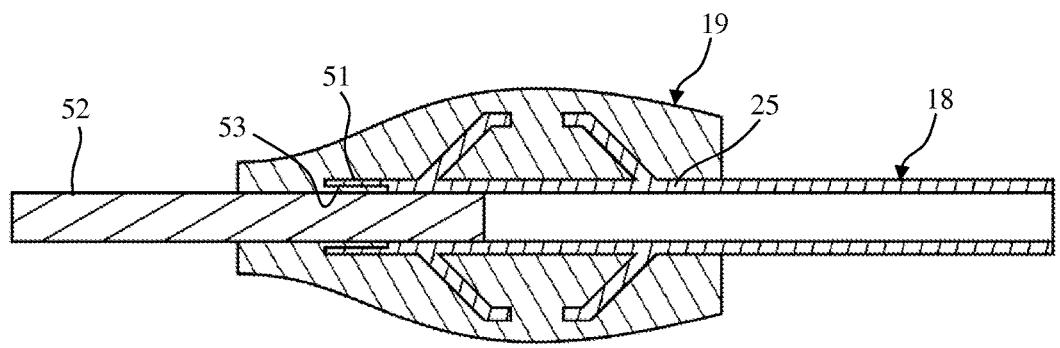
Figure 16C:
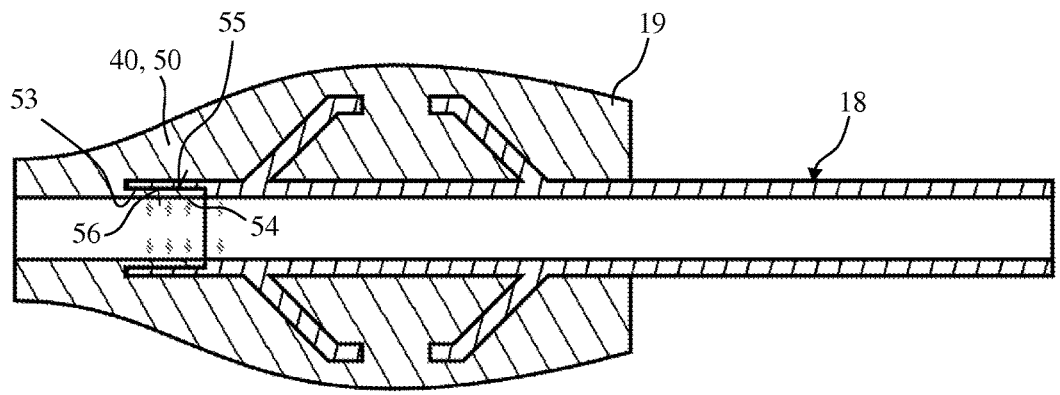

In order to prevent the portion 50 of the second component 19 to lift off or to become otherwise separated from the open end 51 at the positions indicated by arrows in FIG. 15B, the method may be improved as shown in FIG. 16A-16C. According to FIGS. 16A-16C, a shoulder 53 is provided on the inner surface 26 of the tubular body 25. The shoulder 53 has a larger diameter than the remainder of the inner surface 26 of the tubular body 25. The corresponding diameters are indicated by D and d, wherein D is larger than d.

A corresponding space 57 created by the shoulder 53 and the mandrel 52 is filled with molten plastic during injection molding as indicated in FIG. 16B. Once cured, as shown in FIG. 16C, the portion 50 of the second component 19 has an annular engaging section 54 extending into the open end 51 and including an engaging surface 55 engaging an inner surface 56 of the shoulder 53. Thereby, the sealing capacity of the sealing arrangement 17 is increased even further.

Figure 17A:
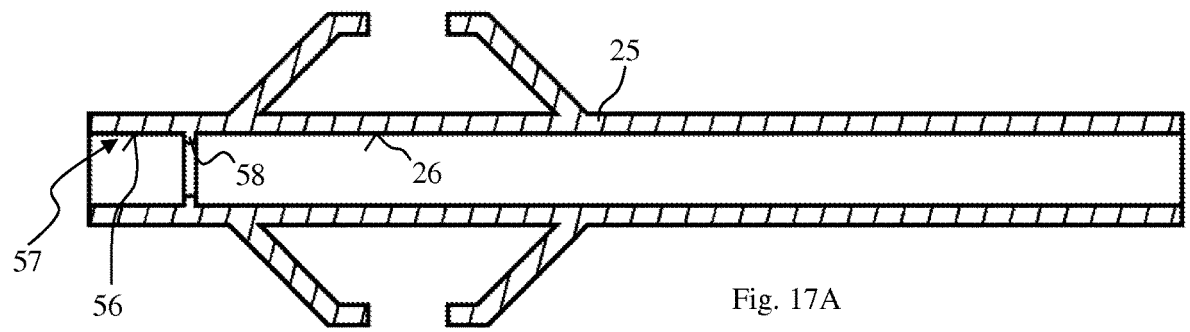
FIGS. 17A to 17C show section views from a further embodiment of a method for manufacturing a sealing arrangement.
Figure 17B:
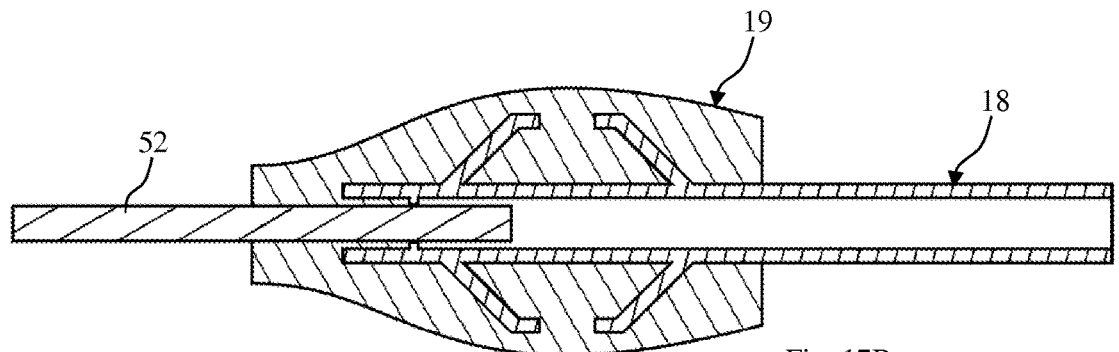
Figure 17C:
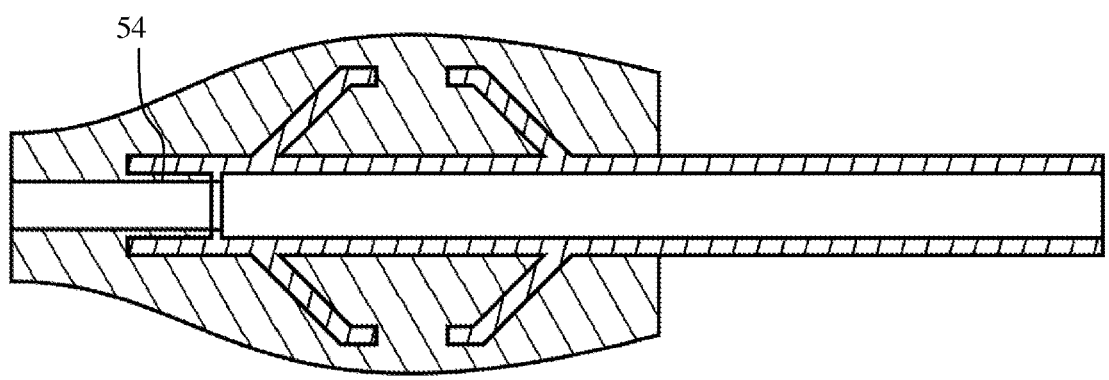

FIG. 17A-17C illustrate that—compared to the embodiment of FIG. 16A-16C—the space 57 for providing the annular engaging section 54 may be provided by way of the inner surface 26 of the tubular body 25 having a protrusion 58 protruding radially inwards from the inner surface 26. Thus, during injection molding, the space 57 is defined by the inner surface 26, the protrusion 58 and the mandrel 52.

Figure 18:
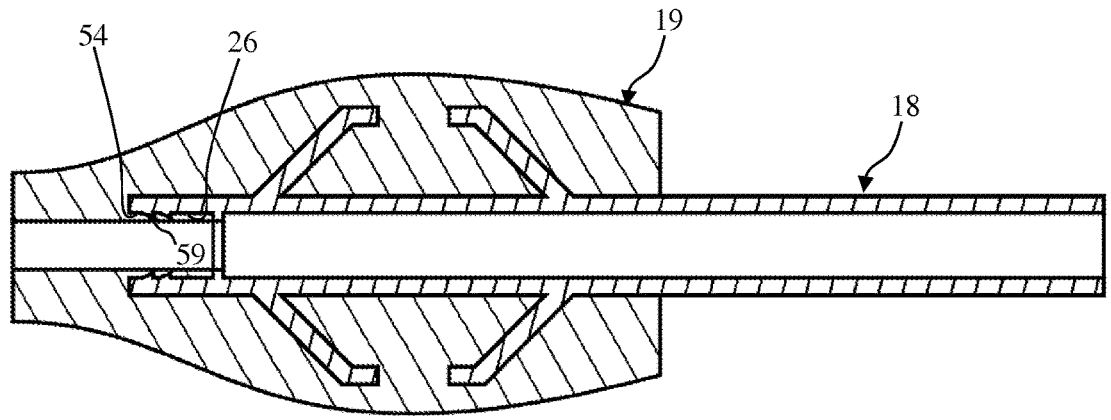
FIG. 18 shows a section view of a further embodiment of a sealing arrangement.

FIG. 18 illustrates the inner surface 56 being engaged by the annular engaging section 54 may, in addition, include hooks or protrusions 59 protruding radially inwards. This may improve engagement between the annular engaging section 54 and the inner surface 26.

Figure 19A:
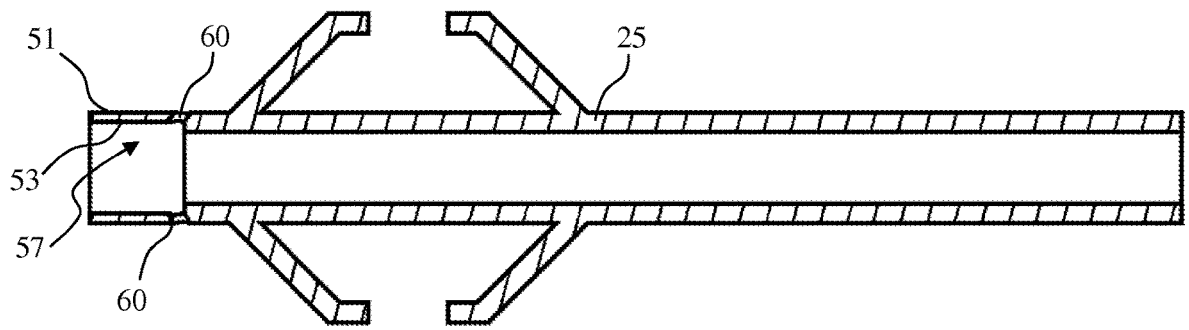
FIGS. 19A to 19C show section views from a further embodiment of a method for manufacturing a sealing arrangement.
Figure 19B:
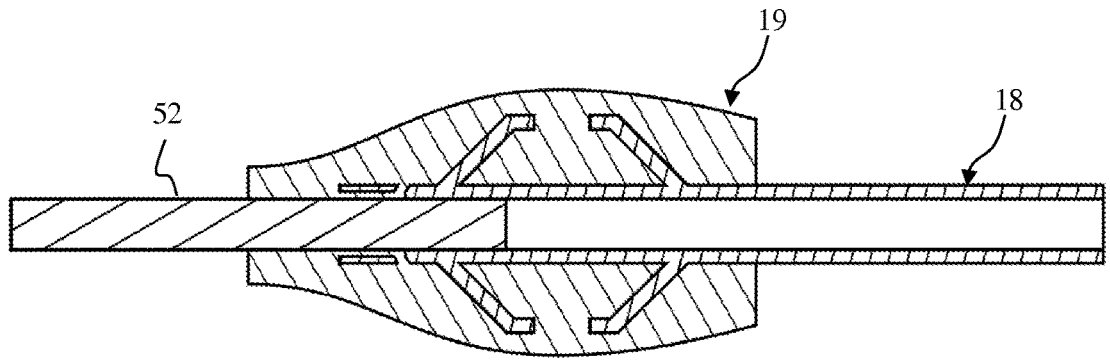
Figure 19C:
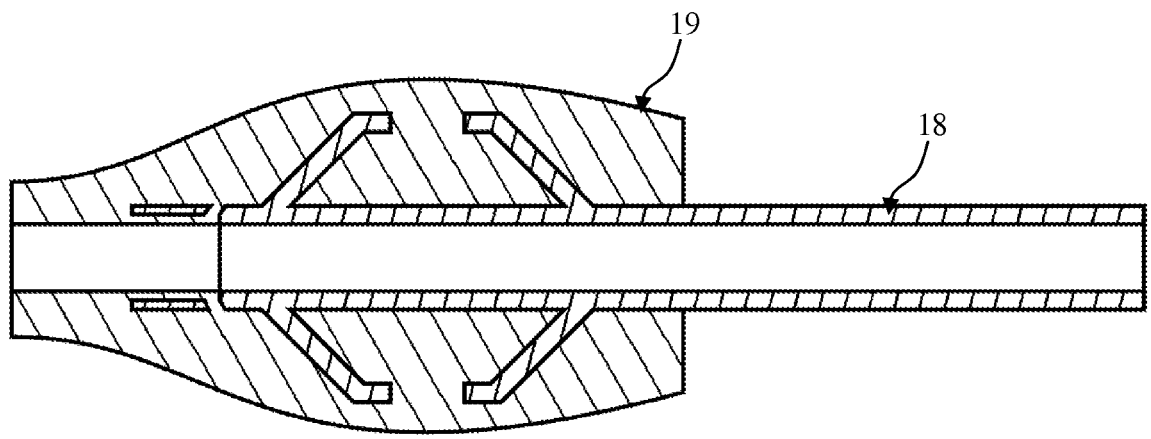

The embodiment of FIGS. 19A-19C differs from the one of FIGS. 16A-16C in that a tubular opening(s) 60 is formed inside the open end 51, thus connecting the space 57 inside the tubular body 25 with the space outside of the tubular body 25. Hence, during injection molding, molten plastic and gas can flow through the tubular opening(s) 60, improving the filling of the space 57 with molten plastic.

Figure 20:
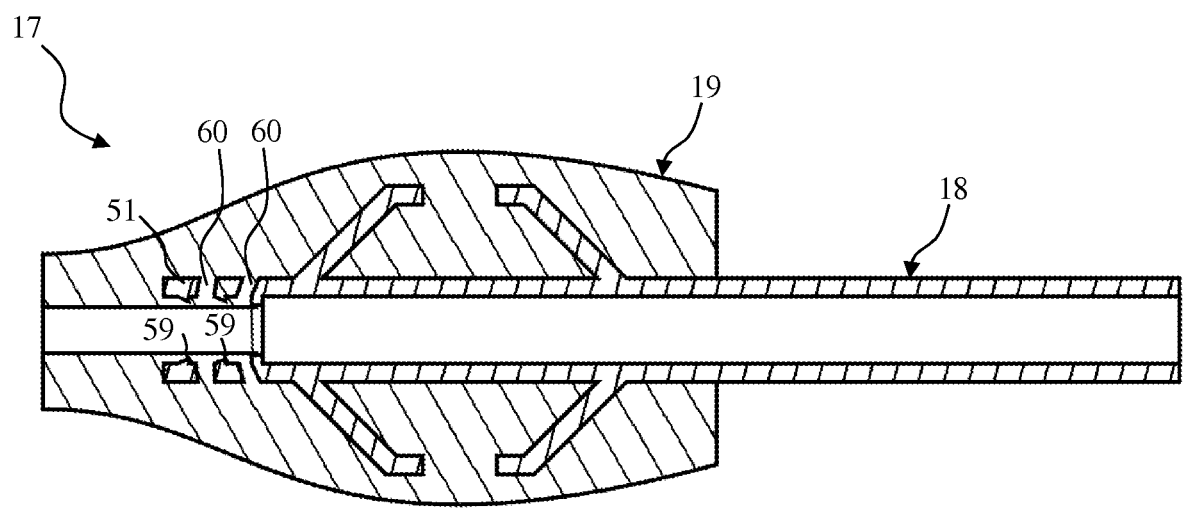
FIG. 20 shows, in a section view, a further embodiment of a sealing arrangement.

FIG. 20 shows an embodiment of a sealing arrangement 17 combining the embodiments of FIGS. 18 and 19A-19C. According to the embodiment of FIG. 20, tubular opening(s) 60 are formed in the open end 51 in sections between the protrusions 59.

Figure 21A:
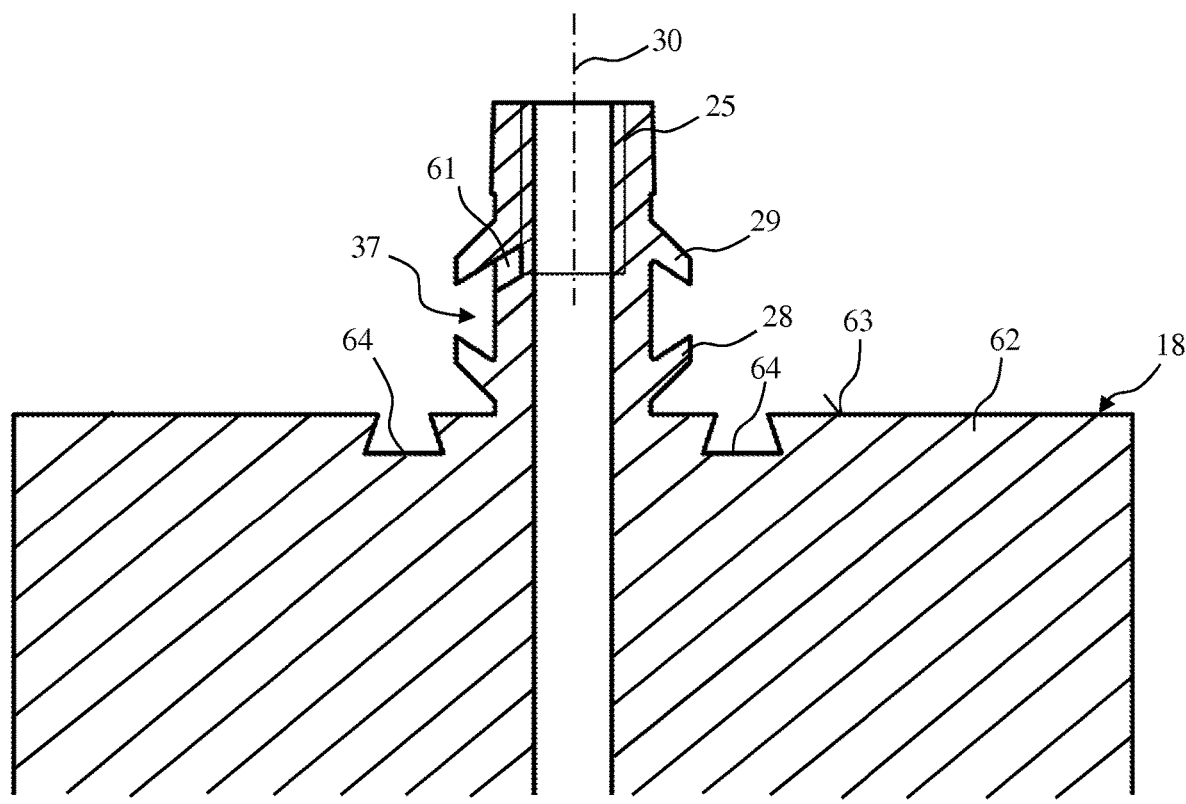
FIG. 21A shows, in a side view, a further embodiment of a first component of a sealing arrangement.
Figure 21B:
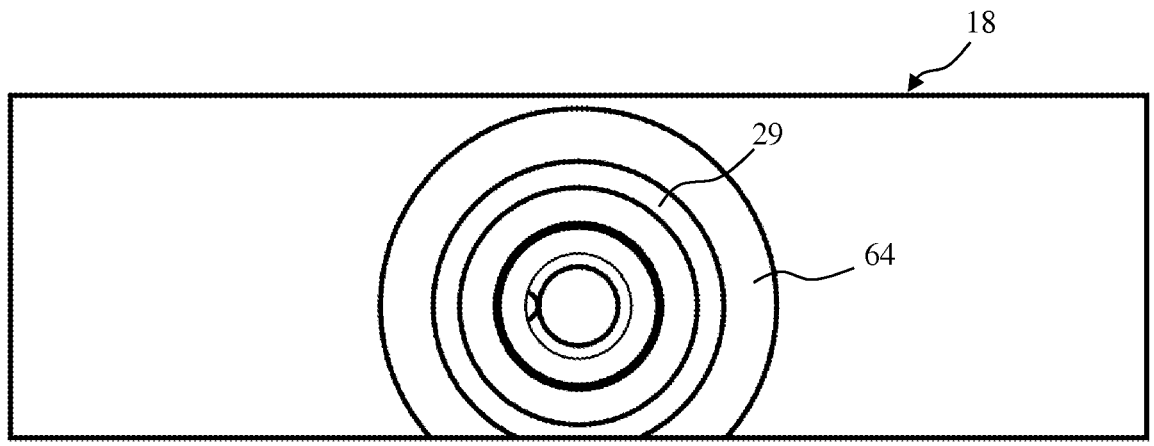
FIG. 21B shows an axial view of a first embodiment of FIG. 21A.

FIG. 21A illustrates an embodiment of a first component 18 in a section view, and FIG. 21B illustrates a view in the axial direction. Compared to the embodiment of FIG. 2A, the first component 18 of FIG. 21A has a body opening 61 extending through the wall thickness of the tubular body 25 between the first collar 28 and second collar 29. During injection molding, gases can flow through the body opening 61, improving the filling of the space 37 between the first collar 28 and second collar 29.

In addition to the body opening 61, or as an alternative, the first component 18 may include a radial section 62 extending radially from the tubular body 25 (and formed in one piece therewith) beyond the first collar 28 and second collar 29. The radial section 62 has an axial face 63 equipped with one or more groove 64, for attaching the second component 19 (not shown) thereto. In particular, the groove 64 may be equipped for a positive fit with the second component 19. In the example of FIG. 21A, each groove 64 is provided in the shape of a circular groove having a swallow-tail cross-section. This is also illustrated in the side view of FIG. 21B.

Figure 21C:
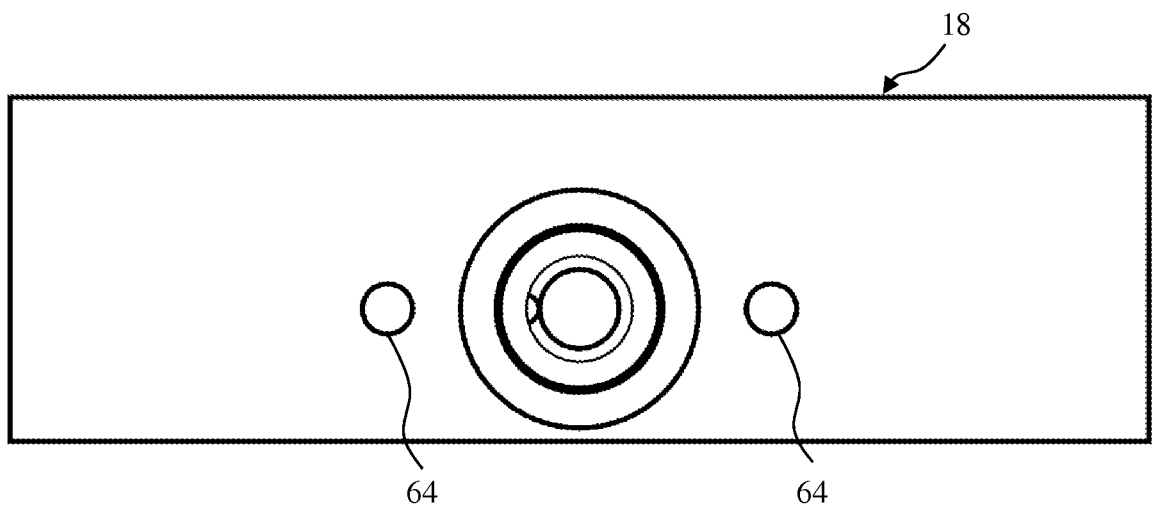
FIG. 21C shows an axial view of a second embodiment of FIG. 21A.

The embodiment of FIG. 21C illustrates an example, where two grooves 64 each shaped as circular holes are provided. The grooves 64 have an undercut (as shown in the context of a different embodiment in FIG. 22) just like the groove 64 of FIG. 21A. The grooves 64 are formed as, for example, grooves 64 drilled into the axial face 63 at an angle. Once the grooves 64 are filled with molten plastic, and the molten plastic is cured, a positive fit in the axial direction between the second component 19 and the first component 18 results.

Figure 22:
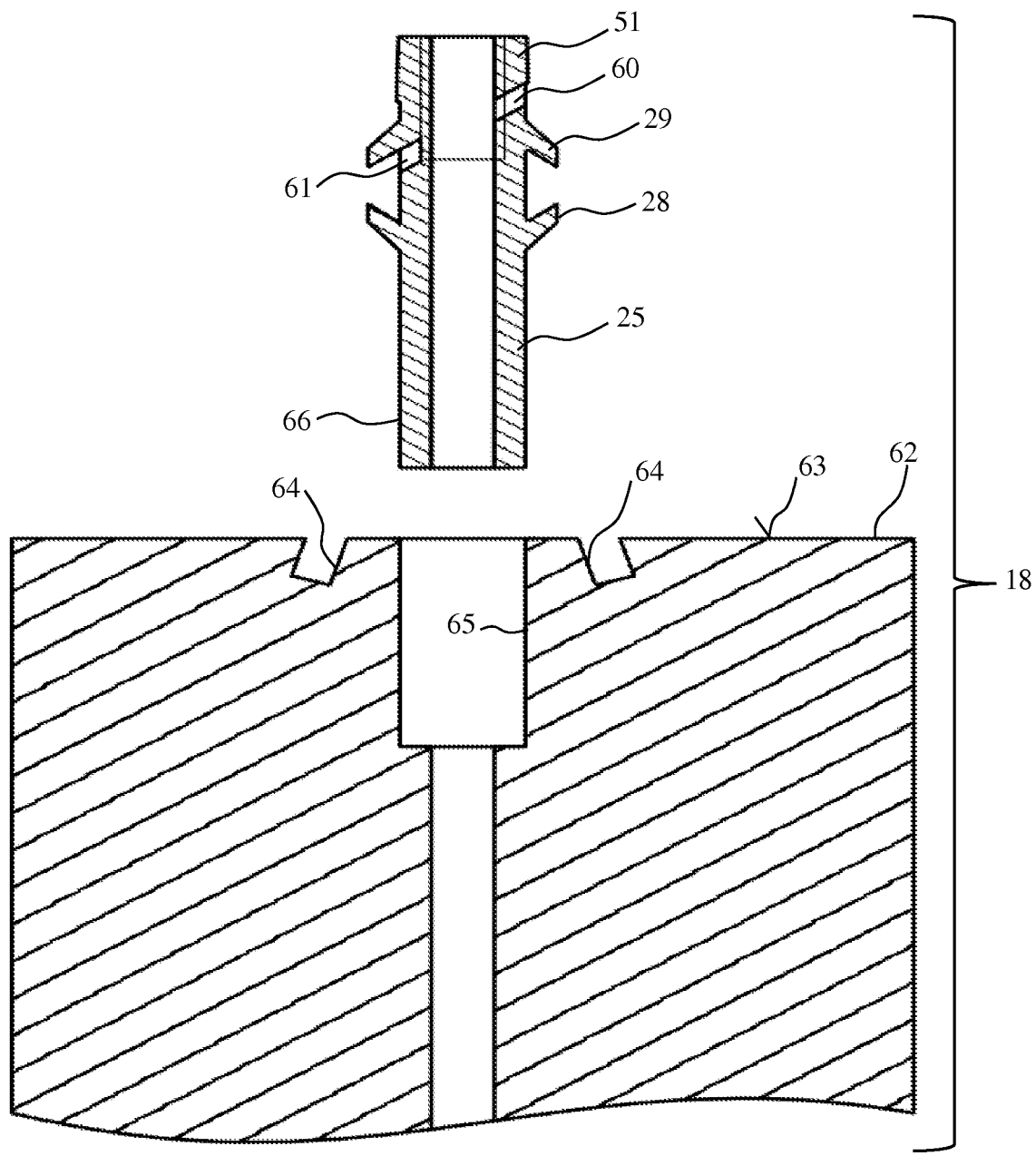
FIG. 22 shows, in a side view, a further embodiment of a first component of a sealing arrangement.

The embodiment of FIG. 22 differs from the embodiment of FIG. 21A in that the first component 18 includes two pieces which are assembled to each other before connecting the first component 18 to the second component 19.

In the embodiment of FIG. 22, the radial section 62 is formed with a cylindrical cutout 65 into which the tubular body 25 including the first collar 28 and second collar 29 is inserted at its end 66 opposite the open end 51.

Figure 23:
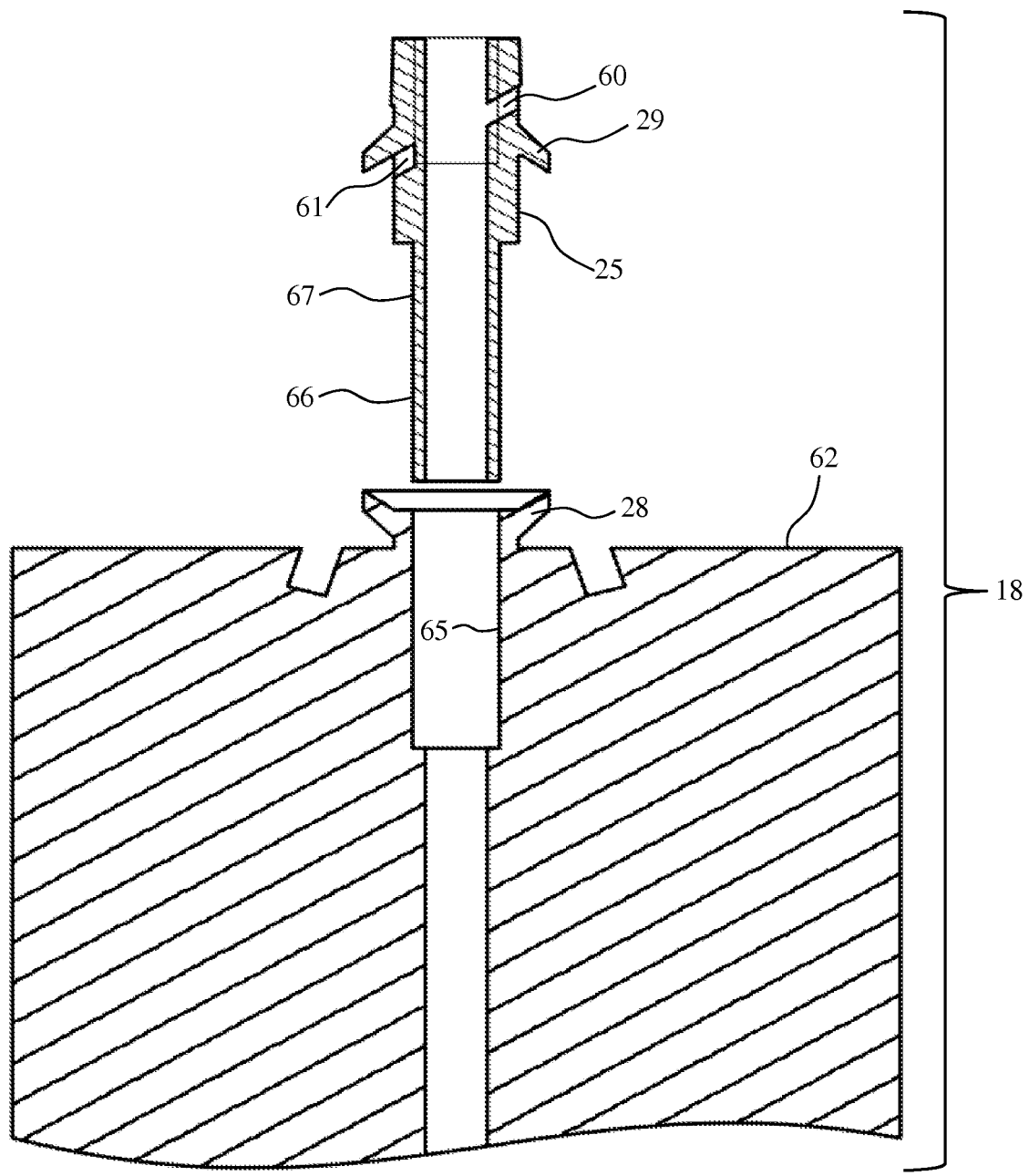
FIG. 23 shows, in a side view, a further embodiment of a first component of a sealing arrangement.

Another embodiment of a first component 18 includes separate tubular body 25 and radial section 62 as illustrated in FIG. 23. The tubular body 25 has only one of the second collar 29, and the end 66 to be inserted into the cylindrical cutout 65 has a shoulder 67. The radial section 62 has a first collar 28 adjacent to the cylindrical cutout 65. The tubular body 25 is inserted with its shoulder 67 into the cylindrical cutout 65 in order to assemble the first component 18.

More generally, while the present invention has been described with reference to certain embodiments, it will be understood by those skilled in the art that various changes may be made and equivalence may be substituted without departing from the scope of the present invention. In addition, many modifications may be made to adapt a particular situation to the teachings of the present invention without departing from its scope. Therefore, it is intended that the present invention not be limited to the particular embodiments disclosed, but that the present invention will include all embodiments falling within the scope of the dependent claims. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A sealing apparatus comprising:
   a first component comprising a body, a first arm, and a second arm protruding from an outer surface of the body, the first arm comprising a first inner surface facing the outer surface of the body, wherein the first inner surface and the outer surface of the body form a first acute angle, and wherein the first inner surface and the outer surface are adjoining surfaces, and the second arm comprising a second inner surface facing the outer surface of the body and the first inner surface, wherein the second inner surface and the outer surface of the body form a second acute angle, and wherein the second inner surface and the outer surface are adjoining surfaces, and wherein the first arm includes a first portion extending from the outer surface of the body and a second portion connected outwardly to the first portion and being inclined with respect to the first portion; and
   a second component attached to the first component, the second component having a first portion arranged inside a space defined between the first inner surface, the second inner surface, and the outer surface of the body and a second portion arranged outside of the space and adjacent to an outer surface of the first arm and an outer surface of the second arm, wherein the second component is a portion of a wall of a casing and is substantially perpendicular to the body of the first component.

2. The sealing apparatus of claim 1, further comprising one or more of:
   the first portion of the second component is prestressed against the first inner surface, the second inner surface, and the outer surface of the body; and
   the second portion of the second component is prestressed against the outer surface of the first arm and the second arm.

3. The sealing apparatus of claim 1, wherein a coefficient of thermal expansion of the first component is different from a coefficient of thermal expansion of the second component.

4. The sealing apparatus of claim 3, wherein during a hot condition the coefficient of thermal expansion of difference causes a force from the first portion of the second component onto the first inner surface of the first arm.

5. The sealing apparatus of claim 3, wherein during a hot condition the coefficient of thermal expansion of difference causes a force from the second portion of the second component onto a first outer surface of the first arm.

6. The sealing apparatus of claim 1, wherein the outer surface of the body and the inner surface of the first arm has an oblique orientation.

7. The sealing apparatus of claim 1, wherein the first portion extends obliquely from the outer surface of the body, and wherein the first inner surface is located on the first portion of the first arm and the second portion of the first arm facing the body.

8. The sealing apparatus of claim 1, the second arm having a shape corresponding to a mirror image of the first arm, a corresponding mirror axis being orientated perpendicularly to the outer surface.

9. The sealing apparatus of claim 1, wherein the first arm has the shape of a collar or a collar section extending at least partially in a circumferential direction of the outer surface of the body.

10. The sealing apparatus of claim 1, further comprising multiple arms located circumferentially about the body of the first component, and wherein the multiple arms contain openings between each arm.

11. The sealing apparatus of claim 10, wherein the multiple arms are staggered.

12. The sealing apparatus of claim 1, wherein the first portion extends obliquely from the outer surface of the body and wherein the first inner surface is located on the first portion of the first arm facing the body.

13. The sealing apparatus of claim 1, wherein the first acute angle and the second acute angle are substantially similar.

14. The sealing apparatus of claim 13, wherein the first acute angle is between about 30° and about 80°.

15. The sealing apparatus of claim 13, wherein the first acute angle is about 45°.

* * * * *